United States Patent
Lee et al.

(10) Patent No.: US 7,271,055 B2
(45) Date of Patent: Sep. 18, 2007

(54) METHODS OF FORMING LOW LEAKAGE CURRENTS METAL-INSULATOR-METAL (MIM) CAPACITORS AND RELATED MIM CAPACITORS

(75) Inventors: Kwang-Hee Lee, Seoul (KR); Jin-Yong Kim, Seoul (KR); Suk-Jin Chung, Gyeonggi-do (KR); Kyu-Ho Cho, Gyeonggi-do (KR); Han-Jin Lim, Seoul (KR); Jin-Il Lee, Gyeonggi-do (KR); Ki-Chul Kim, Seongnam-si (KR); Jae-Soon Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 11/203,347

(22) Filed: Aug. 12, 2005

(65) Prior Publication Data

US 2006/0040457 A1 Feb. 23, 2006

(30) Foreign Application Priority Data

Aug. 19, 2004 (KR) .................... 10-2004-0065607
Nov. 12, 2004 (KR) .................... 10-2004-0092686

(51) Int. Cl.
*H01L 21/8242* (2006.01)
*H01L 29/94* (2006.01)

(52) U.S. Cl. ............... 438/240; 438/240; 438/381; 438/396; 257/306; 257/310; 257/532

(58) Field of Classification Search ............... 438/381, 438/393, 396, 240, 239; 257/306, 310, 532
See application file for complete search history.

(56) References Cited

U.S. PATENT DOCUMENTS

| 6,586,792 | B2 * | 7/2003 | Ahn et al. ............. 257/295 |
| 6,897,106 | B2 * | 5/2005 | Park et al. ............. 438/240 |
| 7,153,786 | B2 * | 12/2006 | Kim et al. ............. 438/785 |
| 2005/0141168 | A1 * | 6/2005 | Lee et al. ............. 361/306.3 |
| 2005/0260357 | A1 * | 11/2005 | Olsen et al. ............. 427/569 |

FOREIGN PATENT DOCUMENTS

| KR | 1020030073934 | 9/2003 |
| KR | 1020030059712 | 10/2003 |
| KR | 1020030085822 | 11/2003 |
| KR | 1020040008992 | 1/2004 |
| KR | 1020040020172 | 3/2004 |

* cited by examiner

*Primary Examiner*—Michael Trinh
(74) *Attorney, Agent, or Firm*—Myers Bigel Sibley & Sajovec

(57) ABSTRACT

Methods of forming MIM comprise forming a lower electrode on a semiconductor substrate, forming a lower dielectric layer on the lower electrode, and forming an upper dielectric layer on the lower dielectric layer. The lower dielectric layer may be formed of dielectrics having larger energy band gap than that of the upper dielectric layer. An upper electrode is formed on the upper dielectric layer. The upper electrode may be formed of a metal layer having a higher work function than that of the lower electrode.

31 Claims, 8 Drawing Sheets

… (1) …

METHODS OF FORMING LOW LEAKAGE CURRENTS METAL-INSULATOR-METAL (MIM) CAPACITORS AND RELATED MIM CAPACITORS

CROSS-REFERENCE TO RELATED APPLICATIONS

This application claims priority under 35 U.S.C. § 119 from Korean Patent Application No. 2004-65607, filed on Aug. 19, 2004, and from Korean Patent Application No. 2004-92686, filed on Nov. 12, 2004, the disclosures of which are hereby incorporated by reference herein as if set forth in their entirety.

FIELD OF THE INVENTION

The present invention relates to semiconductor devices and, more particularly, to metal-insulator-metal (MIM) capacitors and methods of forming such capacitors.

BACKGROUND OF INVENTION

A continuing demand exists for increases in both the performance and integration levels of semiconductor devices. Consistent with this demand, efforts are ongoing to increase the capacitance per unit area of capacitors, thereby allowing the capacitors to be scaled down in size in order to provide increased integration levels. Additionally, efforts are also underway to increase the breakdown voltage of the capacitors in order to improve the performance and/or the reliability of the semiconductor device. Various of these efforts for providing improved capacitors have focused on reducing the thickness of the dielectric layer of the capacitor.

One widely used dielectric layer is a silicon oxide layer that has a dielectric constant of approximately 3.9. When the thickness of such a dielectric layer is reduced, it may result in increased capacitor leakage current. In particular, when the thickness of the silicon oxide layer is reduced below approximately 50 Angstroms, direct tunneling (as opposed to Fowler-Nordheim tunneling) becomes the dominant breakdown mechanism as carriers may move to the electrode through a forbidden gap of the silicon oxide layer. As a result of this direct tunneling phenomena, the leakage current of the capacitor increases. In order to provide thin dielectric layers that maintain a desired level of capacitance without a corresponding increase in the leakage current, high-k dielectric layers have been employed that have a relatively high dielectric constant.

The electrodes of capacitors used in semiconductor devices are often formed of polysilicon. However, polysilicon electrodes may sometimes be inappropriate in capacitors that include high-k dielectric layers, as high-k dielectric layers may exhibit a relatively low energy band gap as compared to conventional silicon oxide dielectric layers. As a result, capacitors that include polysilicon electrodes and a high-k-dielectric layer may exhibit increased leakage currents due to the relatively low energy barrier between the polysilicon electrode and the high-k dielectric layer. In order to avoid this increase in the leakage currents, replacement of the polysilicon electrodes with metal electrodes has been proposed as the metal layer may have a higher work function than that of the polysilicon layer.

A next generation dynamic random access memory (DRAM) devices with a minimum line width of 40 to 90 nm may, for example, need a cell capacitor having about 25 fF of capacitance (C) or more in order to reduce a soft error rate due to alpha particles. As shown in FIG. 1, assuming that the height (H) of the storage node electrode of certain conventional cell capacitors is 3 um, the dielectric layer of the cell capacitor must have an equivalent oxide thickness (EOT) of less than 12 Angstroms to provide the 25 fF of capacitance.

Both a single high-k dielectric layer formed as a tantalum oxide ($Ta_2O_5$) layer and a double high-k dielectric layer formed as a titanium oxide ($TiO_2$) layer and a hafnium oxide ($HfO_2$) layer have been widely used as the dielectric layer in conventional DRAM cell capacitors. Titanium nitride layers have been used to form the electrodes of such conventional DRAM cell capacitors. As illustrated in the graph FIG. 2, even when the dielectric layer of the cell capacitor is formed of a tantalum oxide layer having an EOT of 16 Angstroms, the cell capacitor may exhibit a leakage current density (IL) of more than $1 \times 10^{-5}$ $A/cm^2$ at 1 V of applied voltage (Va). Likewise, even when the dielectric layer of the cell capacitor is a double high-k dielectric layer formed of a titanium oxide layer and a hafnium oxide layer (which dielectric layer has an EOT of 9 Angstroms), the cell capacitor still exhibits a leakage current density (IL) of more than $1 \times 10^{-2}$ $A/cm^2$ at 1 V of applied voltage (Va) as illustrated in the graph of FIG. 2.

SUMMARY OF THE INVENTION

Pursuant to embodiments of the present invention, methods of forming capacitors are provided in which a lower electrode is formed on a semiconductor substrate. A lower dielectric layer having a thickness of about 20 to 40 Angstroms is formed on the lower electrode. An upper dielectric layer having a thickness of about 10 to 60 Angstroms is formed on the lower dielectric layer, where the dielectric constant of the upper dielectric layer is greater than the dielectric constant of the lower dielectric layer. Additionally, the energy band gap of the upper dielectric layer may be smaller than the energy band gap of the lower dielectric layer. An upper electrode is also formed on the upper dielectric layer, where the upper electrode comprises a noble metal that has a higher work function than a work function of the lower electrode. The lower electrode formed by these methods may have, for example, a stack structure, a cylinder structure, or a concave structure.

In these methods, the lower electrode may comprise a metal nitride layer such as, for example, at least one of a titanium nitride (TiN) layer, a titanium silicon nitride (TiSiN) layer, a titanium aluminum nitride (TiAlN) layer, a tantalum nitride (TaN) layer, a tantalum silicon nitride (TaSiN) layer, a tantalum aluminum nitride (TaAlN) layer, and/or a tungsten nitride (WN) layer. The method may also include oxidizing at least some portions of the lower electrode before forming the lower dielectric layer. Such oxidation may be performed, for example, using a rapid thermal oxidation process. In one specific embodiment, the rapid thermal oxidation process is performed for about 10 to 300 seconds at a temperature of about 300 to 550° C. with a pressure of about 0.1 to 760 torr.

In certain embodiments of these methods, the lower dielectric layer may comprise at least one of a hafnium oxide ($HfO_2$) layer, a zirconium oxide ($ZrO_2$) layer, an aluminum oxide ($Al_2O_3$) layer, and/or a lanthanum oxide ($La_2O_3$) layer, and the upper dielectric layer may comprise at least one of a $Ta_2O_5$ layer, a $TiO_2$ layer, a doped $TiO_2$ layer, and/or an STO layer. The upper electrode may comprise, for example, at least one of a Ru layer, an Ir layer, and/or a Pt layer.

Certain embodiments of these methods may also include performing an ammonia plasma treatment process on the lower dielectric layer before forming the upper dielectric layer. An exemplary ammonia plasma treatment process may be performed using a power of about 250 to 350 W at a temperature of about 400° C. or lower and with a pressure of about 2 torr. The method may also include thermally annealing at least the upper dielectric layer in, for example, an $O_2$, $O_3$ and/or $N_2O$ gas atmosphere and/or performing a plasma treatment process on at least the upper dielectric layer using plasma formed from, for example, $O_2$ and/or $N_2O$ gas.

An intermediate dielectric layer may also be formed on the lower dielectric layer before forming the upper dielectric layer. In exemplary embodiments, the intermediate dielectric layer may comprise, for example, at least one of a $HfO_2$ layer, a $ZrO_2$ layer, an $Al_2O_3$ layer, a $La_2O_3$ layer, a $Ta_2O_5$ layer, a $TiO_2$ layer, and/or an STO layer. The intermediate dielectric layer may be thermally annealed in, for example, an $O_2$, $O_3$ and/or $N_2O$ gas atmosphere and/or a plasma treatment process may be performed on the intermediate dielectric layer using plasma formed from, for example, $O_2$ and/or $N_2O$ gas.

Pursuant to further embodiments of the present invention, MIM capacitors are provided that include a lower electrode on a semiconductor substrate, a lower dielectric layer having a thickness of 20 to 40 Angstroms on the lower electrode, an upper dielectric layer having a thickness of 10 to 60 Angstroms on the lower dielectric layer, and an upper electrode on the upper dielectric layer, where the upper electrode comprises a noble metal that has a higher work function than a work function of the lower electrode. In these capacitors, the lower dielectric layer has a first dielectric constant and a first energy band gap and the upper dielectric layer has a second dielectric constant and a second energy band gap. The second dielectric constant may be higher than the first dielectric constant and the second energy band gap may be smaller than the first energy band gap.

In these capacitors, the lower electrode may comprise a metal nitride layer such as, for example, at least one of a titanium nitride (TiN) layer, a titanium silicon nitride (TiSiN) layer, a titanium aluminum nitride (TiAlN) layer, a tantalum nitride (TaN) layer, a tantalum silicon nitride (TaSiN) layer, a tantalum aluminum nitride (TaAlN) layer, and/or a tungsten nitride (WN) layer. In certain embodiments, at least certain surface portions of the lower electrode may be oxidized. The lower dielectric layer may comprise, for example, at least one of a hafnium oxide ($HfO_2$) layer, a zirconium oxide ($ZrO_2$) layer, an aluminum oxide ($Al_2O_3$) layer, and/or a lanthanum oxide ($La_2O_3$) layer.

In certain embodiments of these capacitors, an intermediate dielectric layer may be provided between the lower dielectric layer and the upper dielectric layer. This intermediate dielectric layer may comprise, for example, at least one of a $HfO_2$ layer, a $ZrO_2$ layer, an $Al_2O_3$ layer, a $La_2O_3$ layer, a $Ta_2O_5$ layer, a $TiO_2$ layer, and/or an STO layer. The upper dielectric layer may comprise, for example, at least one of a $Ta_2O_5$ layer, a $TiO_2$ layer, and/or an STO layer. The upper electrode may comprise, for example, at least one of a Ru layer, an Ir layer, and a Pt layer.

Pursuant to still further embodiments of the present invention, MIM capacitors are provided which include a lower electrode on a semiconductor substrate, a lower dielectric layer on the lower electrode, the lower dielectric layer having a first dielectric constant and a first energy band gap, an upper dielectric layer on the lower dielectric layer, the upper dielectric layer having a second dielectric constant and a second energy band gap and an upper electrode on the upper dielectric layer, the upper electrode comprising a noble metal that has a higher work function than a work function of the lower electrode. In these capacitors, the second dielectric constant may be higher than the first dielectric constant and the second energy band gap may be smaller than the first energy band gap.

In certain specific embodiments, the capacitor may include an intermediate dielectric layer between the lower dielectric layer and the upper dielectric layer. This intermediate dielectric layer may have an amorphous structure, and at least one of the lower dielectric layer or the upper dielectric layer may have a crystalline structure. The intermediate dielectric layer may comprise, for example, at least one of a $HfO_2$ layer, a $ZrO_2$ layer, an $Al_2O_3$ layer, a $La_2O_3$ layer, a $Ta_2O_5$ layer, a $TiO_2$ layer, and/or an STO layer. The lower dielectric layer may have a thickness, for example, of about 20 to 40 Angstroms. The upper dielectric layer hay have a thickness, for example, of about 10 to 60 Angstroms.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
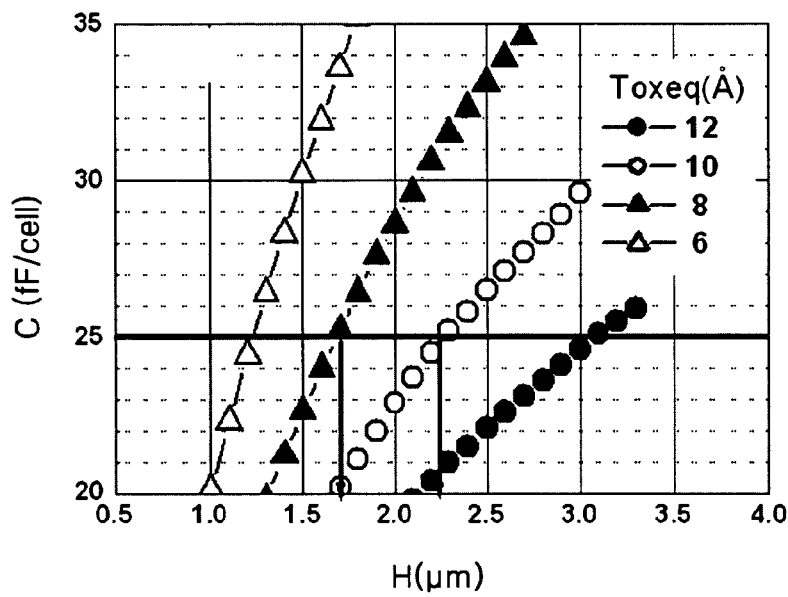
FIG. 1 is a graph illustrating cell capacitance as a function of height and EOT for typical conventional cylindrical-type storage node electrode capacitors.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 3A to 3D are cross-sectional diagrams illustrating methods of forming MIM capacitors according to certain embodiments of the present invention.

Figure 3A:
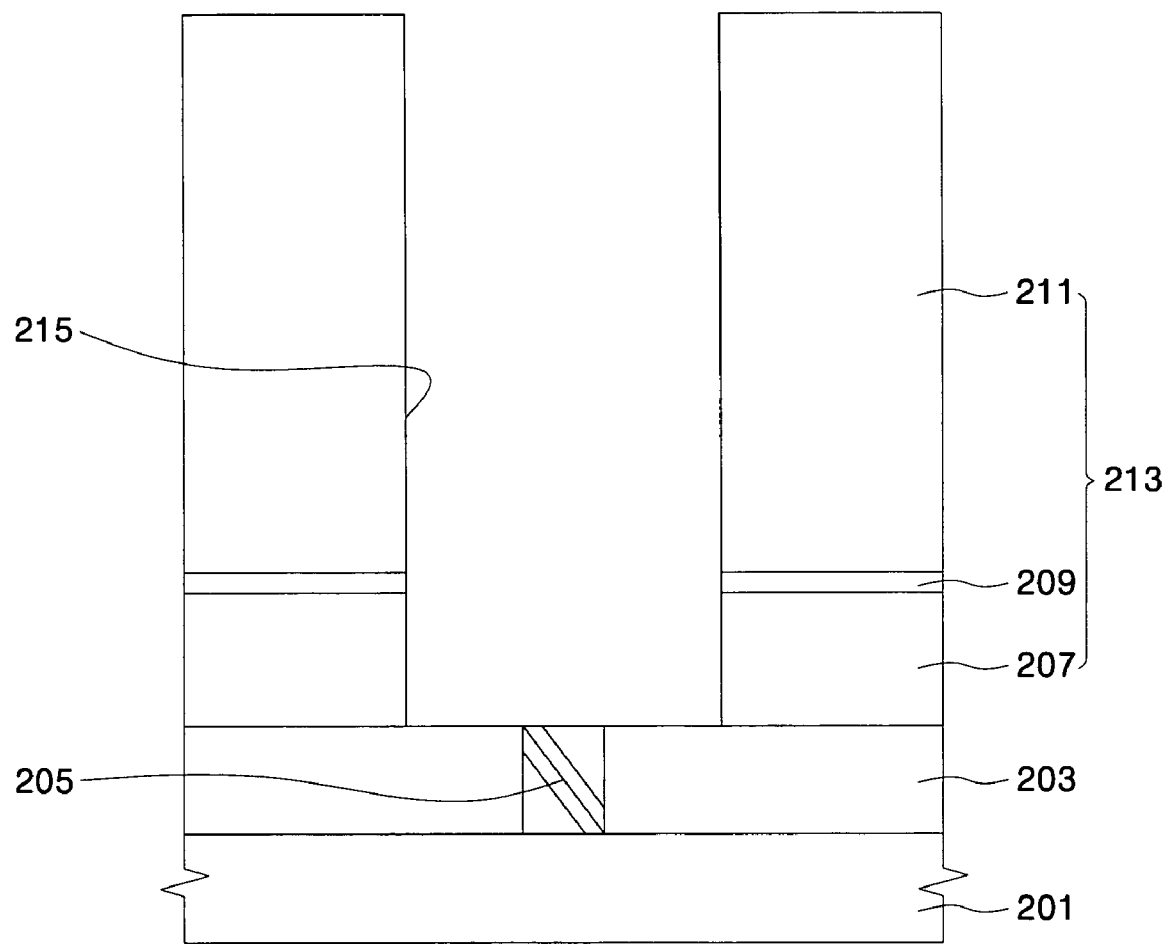
FIGS. 3A to 3D are cross-sectional diagrams illustrating methods of forming MIM capacitors according to certain embodiments of the present invention.

As shown in FIG. 3A, pursuant to certain embodiments of the present invention, a MIN capacitor may be formed by forming an interlayer insulating layer 203 on a semiconductor substrate 201. The interlayer insulating layer 203 may be patterned to form a contact hole that exposes the semiconductor substrate 201, and a contact plug 205 may be formed in the contact hole. A mold insulating layer 213 is formed on the substrate having the contact plug 205. As shown in FIG. 3A, in one specific embodiment, the mold insulating layer 213 may be formed by sequentially stacking a lower mold insulating layer 207, an etch stop layer 209, and an upper mold insulating layer 211 on the substrate having the contact plug 205. However, it will be appreciated that numerous other implementations and configurations for the mold insulating layer 213 are possible. For example, the etch stop layer 209 can, in certain embodiments, be formed directly on the contact plug 205 and the interlayer insulating layer 203. In other embodiments, the mold insulating layer 213 may be formed as a double-layered mold insulating layer that includes the lower mold insulating layer 207 and the upper mold insulating layer 211. In still further embodiments, the mold insulating layer may be formed as a single mold insulating layer. The mold insulating layer may also include layers in addition to the layers depicted in FIG. 3A.

In certain embodiments of these methods, the lower mold insulating layer 207 and the upper mold insulating layer 211 may have an etch selectivity with respect to the etch stop layer 209. For example, if the lower mold insulating layer 207 and the upper mold insulating layer 211 comprise silicon oxide layers, the etch stop layer 209 may be a silicon nitride layer. As shown in FIG. 3A, the mold insulating layer 213 may be patterned to form a storage node hole 215 that exposes an upper surface of the contact plug 205 and an upper surface of the interlayer insulating layer 203 that is adjacent to the contact plug.

Figure 3B:
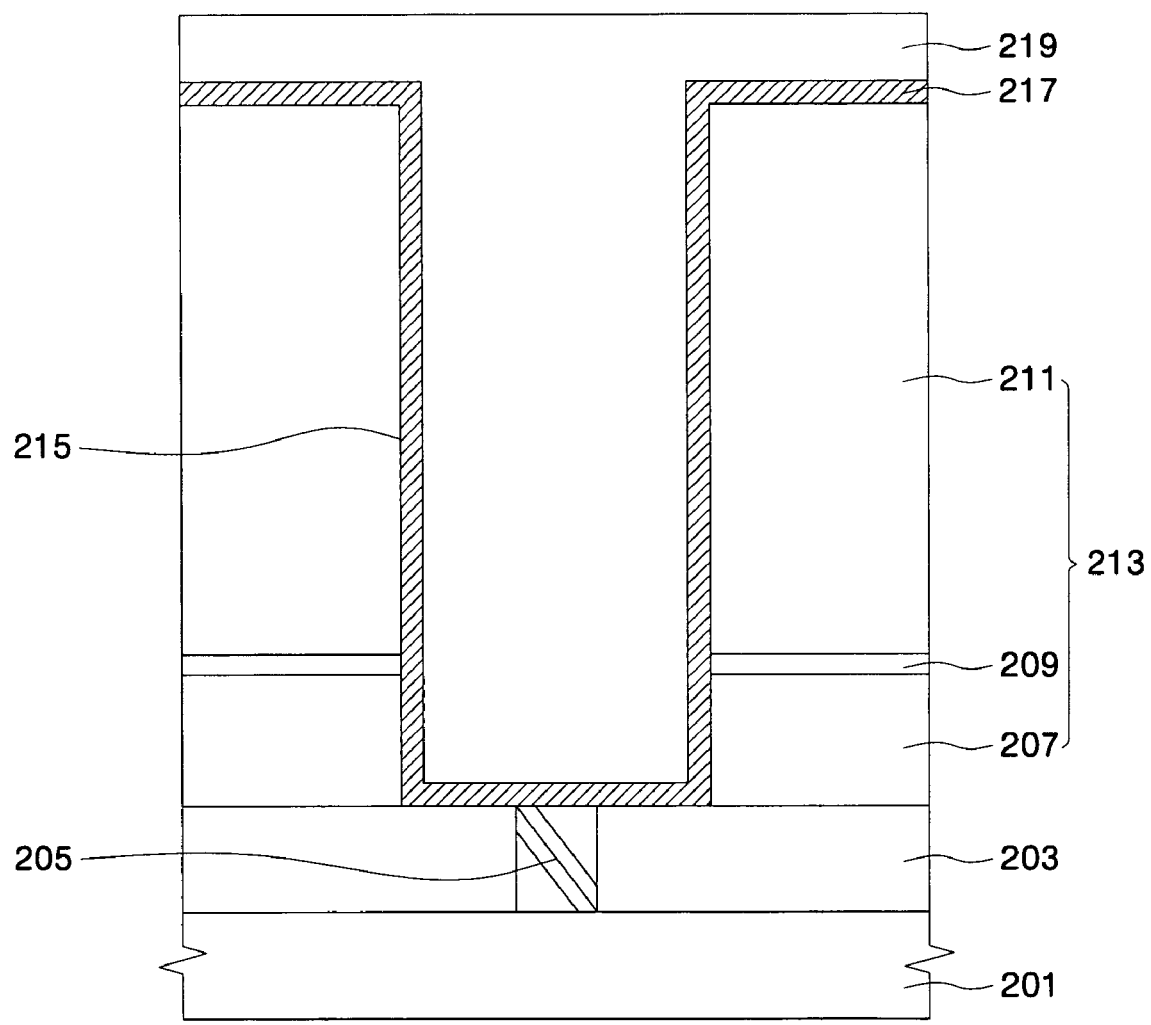

As shown in FIG. 3B, a conductive layer 217 that is used to form a lower electrode 217' (see FIG. 3C) may be formed on the mold insulating layer 213 and within the storage node hole 215. This conductive layer 217 may be formed of a material having good step coverage. The conductive layer 217 may also be formed of a material that is relatively resistant to deformation during the processing step(s) used to form the capacitor dielectric(s) and/or upper electrode, as such deformation, which may occur, for example, as a result of grain growth and/or agglomeration, may result in increased leakage current through the dielectric(s). The material used to form the conductive layer 217 may also be relatively resistant to oxidation.

By way of example, the conductive layer 217 may be a metal nitride such as titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and/or tungsten nitride (WN). The conductive layer 217 may be relatively rigid so that it resists deformation during subsequent processing steps. The conductive layer 217 may be formed, for example, via a chemical vapor deposition (CVD) method or an atomic layer deposition (ALD) method.

As is further shown in FIG. 3B, a buffer insulating layer 219 may be formed on the conductive layer 217. If the capacitor is to have a concave shape, the buffer insulating layer 219 may, for example, be formed of a material that has an etch selectivity with respect to the mold insulating layer 213. If the capacitor is to have a cylindrical shape, the buffer insulating layer 219 may, for example, be formed of a material that has approximately the same etch rate as that of the mold insulating layer 213.

Figure 3C:
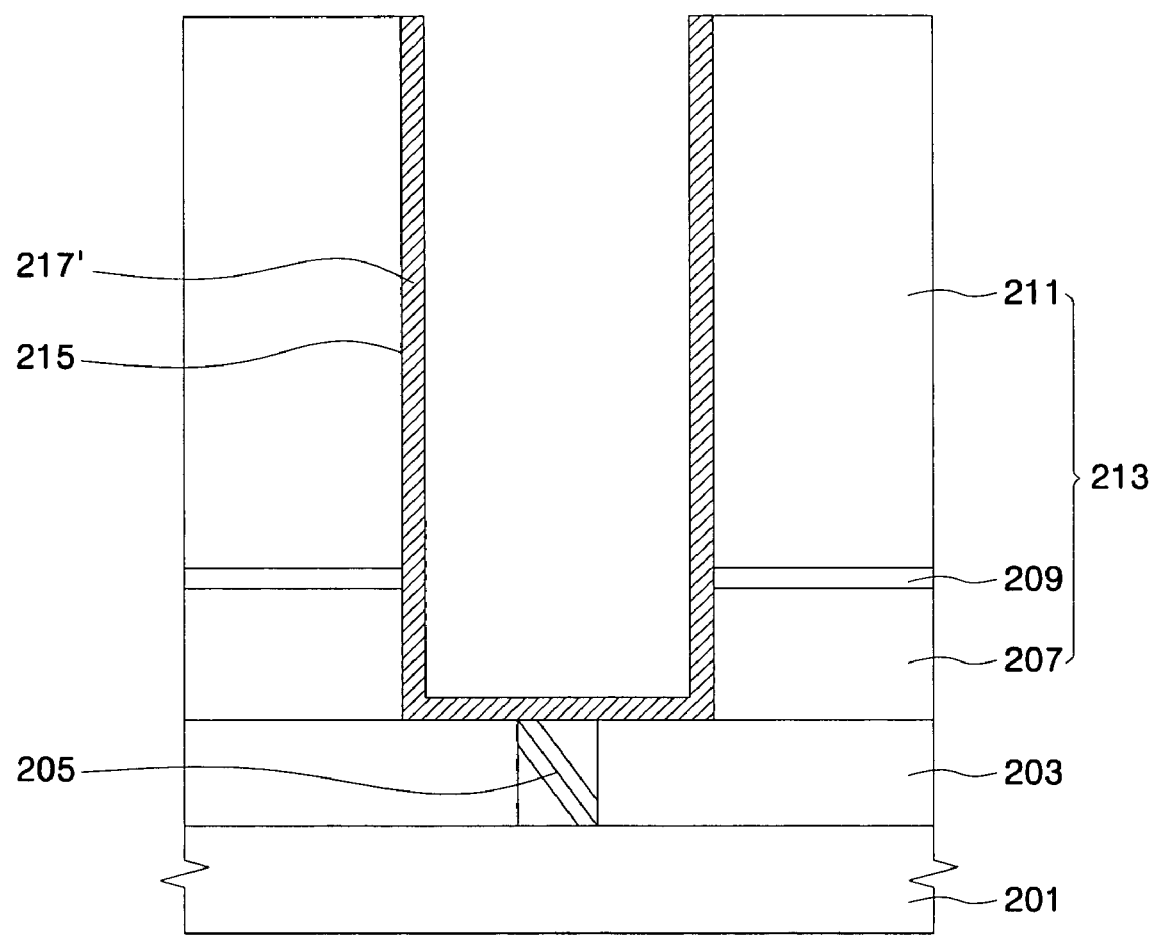

Next, as shown in FIGS. 3B and 3C, the buffer insulating layer 219 and the conductive layer 217 may be planarized to expose an upper surface of the mold insulating layer 213 and to form the lower electrode 217'. Such planarization may be accomplished, for example, using a chemical mechanical polishing (CMP) process or an etch back process or other techniques known to those of skill in the art. The buffer insulating layer pattern that remains in the storage node hole 215 may then be selectively removed to expose the inner walls of the lower electrode 217', thereby forming (in this exemplary embodiment) a concave-shaped capacitor. In other exemplary embodiments, the mold insulating layer 213 and the buffer insulating layer pattern may be removed concurrently to form a cylindrical-shaped capacitor.

Figure 3D:
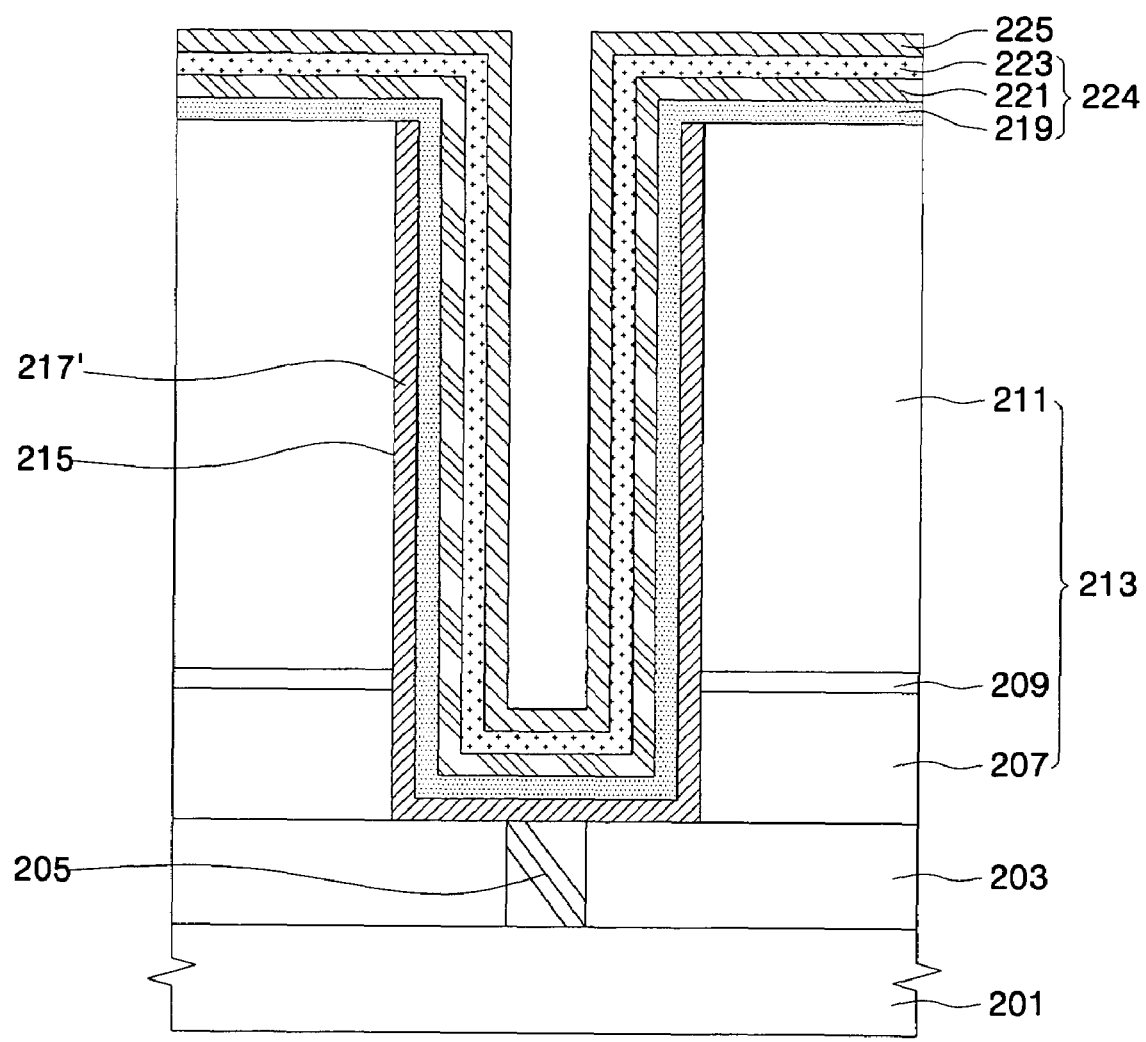

As shown in FIG. 3D, a dielectric layer 224 may be conformably formed on the surface of the semiconductor substrate having the lower electrode 217'. The dielectric layer 224 may be formed, for example, by sequentially stacking a lower dielectric layer 219 and an upper dielectric layer 223. The lower dielectric layer 219 and the upper dielectric layer 223 may be formed of high-k dielectric materials that have a high dielectric constant as compared to silicon oxide. The upper dielectric layer 223 may be formed of a high-k dielectric layer that has a higher dielectric constant than the lower dielectric layer 219. Further, the lower dielectric layer 219 may be formed of a dielectric layer that has a large energy band gap as compared to the energy band gap of the upper dielectric layer 223.

As is also shown in FIG. 3D, an upper electrode 225 may be formed on the upper dielectric layer 223. In certain embodiments of the present invention, the upper electrode 225 may be formed of a metal layer that has a higher work function than that of the lower electrode 217'. As a result, in certain embodiments of the present invention, both the energy barrier between the upper electrode 225 and the upper dielectric layer 223 and the energy barrier between the lower electrode 217' and the lower dielectric layer 219 can be increased as compared to various conventional capacitors. This may significantly reduce the amount of leakage current flowing through the dielectric layer 224 between the lower electrode 217' and the upper electrode 225. The upper electrode 225 may be formed, for example, of at least one noble metal layer selected from the group consisting of a Ru layer, a Pt layer, and an Ir layer. Generally, a dielectric layer having a high dielectric constant has a smaller energy band gap as compared to a dielectric layer having a low dielectric constant. Therefore, when the dielectric layer 224 uses a dielectric having a high dielectric constant, a material having a relatively high work function can be located next to the electrode, which may facilitate suppressing the generation of leakage current. Moreover, by implementing the lower dielectric layer 219 as a low-k dielectric layer that has a relatively large energy band gap, and by implementing the upper dielectric layer 223 as a high-k dielectric layer that has a relatively high dielectric constant, the leakage current characteristics and/or capacitance of the capacitor may be improved. In an exemplary embodiment of the present invention, the upper dielectric layer 223 may comprise $Ta_2O_5$, $TiO_2$, doped $TiO_2$ and/or STO. The lower dielectric layer 219 may comprise $HfO_2$, $ZrO_2$, $Al_2O_3$, and/or $La_2O_3$.

The lower dielectric layer 219 may be formed in an atmosphere of oxidation ambient gas. When the lower electrode 217' is formed as a titanium nitride (TiN) layer, a titanium monoxide (TiO) layer, a titanium oxynitride (TiON) layer, and/or a titanium dioxide ($TiO_2$) layer may be formed on the surface of the lower electrode 217' during the formation of the lower dielectric layer 219. When the titanium dioxide ($TiO_2$) layer is formed, the volume of the lower electrode 217' may expand. If unaddressed, this may result in deterioration of the surface morphology of the lower electrode 217', which can increase leakage current between the lower electrode 217' and the upper electrode 225. Therefore, pursuant to certain embodiments of the present invention, a relatively dense and uniform oxide layer such as, for example, a TiON layer may be formed on the surface of the lower electrode 217' in order to suppress non-uniform oxidation of the lower electrode 217' during the formation of the lower dielectric layer 219.

In certain embodiments of the present invention, a plasma oxidation process and/or a rapid thermal oxidation process may be applied to the lower electrode 217'. The plasma oxidation process may be used to locally oxidize some or all of the lower electrode 217'. Such a rapid thermal oxidation process may be performed, for example, for about 10 to 300 seconds at a temperature of about 300 to 550° C. and with a pressure of about 0.1 to 760 torr.

After the lower dielectric layer 219 and/or the upper dielectric layer 223 are formed, a thermal annealing or plasma treatment may be performed, which may improve the dielectric property of the lower dielectric layer 219 and/or the upper dielectric layer 223. The thermal annealing process may be performed using, for example, $O_3$, $O_2$ and/or $N_2O$, or a mixture of two or more gases thereof. In certain embodiments of the present invention, this thermal annealing process may be performed for about 1 to 20 minutes at a temperature of about 150 to 500° C. The plasma treatment process may be performed using, for example, $O_2$ and/or $N_2O$. The plasma treatment process may be performed for about 1 to 20 minutes using about 50 to 800 W of power.

In certain embodiments of the present invention, an intermediate dielectric layer 221 may be formed on the lower dielectric layer 219 prior to forming the upper dielectric layer 223. In certain specific embodiments, the lower dielectric layer 219 may be formed of one or more crystalline or amorphous $HfO_2$ layers, $ZrO_2$ layers, $Al_2O_3$ layers and/or $La_2O_3$ layers. The intermediate dielectric layer 221 may be formed of one or more crystalline or amorphous $HfO_2$ layers, $ZrO_2$ layers, $Al_2O_3$ layers, $La_2O_3$ layers, $Ta_2O_5$ layers, TiO layers (doped or undoped), and/or STO layers. The upper dielectric layer 223 may be formed of one or more crystalline or amorphous $Ta_2O_5$ layers, TiO layers (doped or undoped), and/or STO layers. By forming the intermediate dielectric layer 221 to have a crystalline or amorphous structure, the electrical characteristics of the dielectric layer 224 may be improved. For example, if the lower dielectric layer 219 and the upper dielectric layer 223 are formed to have crystalline structures, the breakdown voltage characteristic of the lower dielectric layer 219 and the upper dielectric layer 223 may be improved, but the leakage current characteristic may be deteriorated. By providing an intermediate dielectric layer 221 that has an amorphous structure between the lower dielectric layer 219 and the upper dielectric layer 223, the electrical characteristics of the capacitor, such as leakage current characteristic and breakdown voltage characteristic, can be improved.

When the lower dielectric layer 219 is formed as a hafnium oxide layer using an atomic layer deposition (ALD) method, tetra-ethyl-methyl amino hafnium (TEMAH) may, for example, be supplied as a deposition source gas. $H_2O$ or $O_3$ gas may, for example, be supplied as the oxidation gas to form the hafnium oxide layer. The $H_2O$ or $O_3$ gas that is supplied as the oxidation gas may increase reactivity, which may facilitate providing a hafnium oxide layer having a crystalline structure and relatively few impurities. The intermediate dielectric layer 221 may also be formed using an ALD method, in which, for example, one cycle of a process that includes oxidation gas supply/purge/oxidation gas supply/purge may be repeatedly performed. In this process, TEMAH may, for example, be supplied as the deposition source gas, and $O_2$ gas may, for example, be supplied as the oxidation gas. By supplying $O_2$ gas as the oxidation gas (as opposed to $H_2O$ or $O_3$ gas) the reactivity may be relatively decreased, and the hafnium oxide layer may thus be formed to have amorphous structure with a higher concentration of impurities such as carbon or the like.

The upper dielectric layer 223 may be, for example, a tantalum oxide ($Ta_2O_5$) or titanium oxide ($TiO_2$) layer that is formed using, for example, $O_2$ or $O_3$ as the oxidation gas. The lower and upper dielectric layers 219, 223 may also be formed to have an amorphous structure as opposed to a crystalline structure.

It will be appreciated that the hafnium oxide ($HfO_2$) lower dielectric layer 219 may be formed in multiple different ways, such as by CVD or ALD. When the ALD method is used to form the hafnium oxide ($HfO_2$) layer, TEMAH and $O_3$ gas may be supplied as source materials, and the hafnium oxide ($HfO_2$) layer may be formed, for example, to a thickness of about 20 to 40 Angstroms. In certain specific embodiments, the hafnium oxide ($HfO_2$) layer may be formed to have a thickness of about 25 to 35 Angstroms.

When the dielectric layer 224 is formed as a double-layered dielectric that includes a lower dielectric layer 219 and an upper dielectric layer 223, the leakage current characteristic of the double-layered dielectric may vary significantly with the thickness of the lower dielectric layer 219 and the thickness of the upper dielectric layer 223. In the embodiment, when the lower dielectric layer 219 comprises a hafnium oxide ($HfO_2$) layer with a thickness of about 30 Angstroms and the upper dielectric layer 223a comprises a titanium oxide ($TiO_2$) layer with a thickness of about 30 Angstroms, the dielectric layer 224 can provide excellent cell capacitance and leakage current characteristics.

When the lower dielectric layer 219 comprises, for example, a hafnium oxide ($HfO_2$) layer, an ammonia plasma treatment process may optionally be performed on the lower dielectric layer 219 to remove impurities in the lower dielectric layer 219. In such embodiments of the present invention, the ammonia plasma treatment process may, for example, be performed using about 250 to 350 W of power at a temperature lower than about 400° C. and with a pressure of about 2 torr. In an exemplary embodiment of the ammonia plasma treatment, ammonia and nitrogen gases are supplied to the lower dielectric layer 219 at flow rates of 300 sccm (standard cubic centimeter per minute) and 3000 sccm, respectively.

When the upper dielectric layer 223 comprises, for example, a titanium oxide ($TiO_2$) layer, the titanium oxide layer may likewise be formed, for example, using an ALD process using, for example, $TiCl_4$ or TTIP as the titanium source gas and $O_3$ as the oxidation gas. In some embodiments of the present invention, the titanium oxide layer is formed at a low temperature (e.g., lower than about 350° C.), in order to reduce and/or minimize oxidation of the lower electrode (TiN). For example, in certain embodiments of the present invention, the titanium oxide layer is formed at a temperature of about 250 to 300° C. Moreover, if the titanium oxide ($TiO_2$) layer is formed to a thickness greater than about 30 Angstroms, the titanium oxide layer may be more susceptible to changing into a crystalline structure, which may, if unaddressed, increase the leakage current of the capacitor. Accordingly, in certain embodiments of the present invention, the titanium oxide layer is formed to a thickness of about 10 to 30 Angstroms.

When the upper electrode 225 comprises a ruthenium (Ru) layer, the upper electrode may be formed, for example, using $Ru(EtCp)_2$ as the ruthenium source gas and $O_2$ as the reactant gas. The ruthenium layer may also be formed at a temperature of about 300° C. or lower, which may facilitate suppressing additional oxidation of the lower electrode (TiN). In other embodiments of the present invention, other ruthenium source gases such as, for example, $Ru(OD)_3$ or a beta-dicatonate group of source gas such as $Ru(nbd)(iHD)_2$ may be used. With some of these source gases, the layer may be formed at a process temperature higher than 300° C., even though this may increase the leakage current of the capacitor.

As noted above, the upper dielectric layer 223 may comprise, for example, a tantalum oxide ($Ta_2O_5$) layer. Such a tantalum oxide layer may be also formed using, for example, a CVD or ALD process. The tantalum oxide layer may be formed using $Ta(OEt)_5$ as a source gas and $O_2$ as the oxidation gas, and may be formed, for example at a temperature of about 400 to 450° C. In certain embodiments of the present invention, the tantalum oxide layer is formed to a thickness of about 20 to 60 Angstroms. In certain specific embodiments, the tantalum oxide layer may be formed to a thickness of about 20 to 50 Angstroms.

As noted above, the MIM capacitors according to some embodiments of the present invention may have a concave-shape or a cylindrical-shape. It will be appreciated, however, that the present invention is not limited to the above embodiments, but may be employed to form capacitors having a wide variety of different configurations. For example, in other embodiments of the present invention the MIM capacitors may have planar type stacked structures.

It will be appreciated that the lower dielectric layer and/or the upper dielectric layer of MIM capacitors according to embodiments of the present invention may be formed as separate layers of two or more different materials that exhibit different dielectric constants and/or energy band gaps. In such embodiments, the dielectric constant of such a multi-layer lower (or upper) dielectric layer may be the average of the dielectric constants for the multiple layers weighted by thickness, and the energy band gap of such a multi-layer lower (or upper) dielectric layer may be the average of the energy band gaps for the multiple layers weighted by thickness.

Figure 4A:
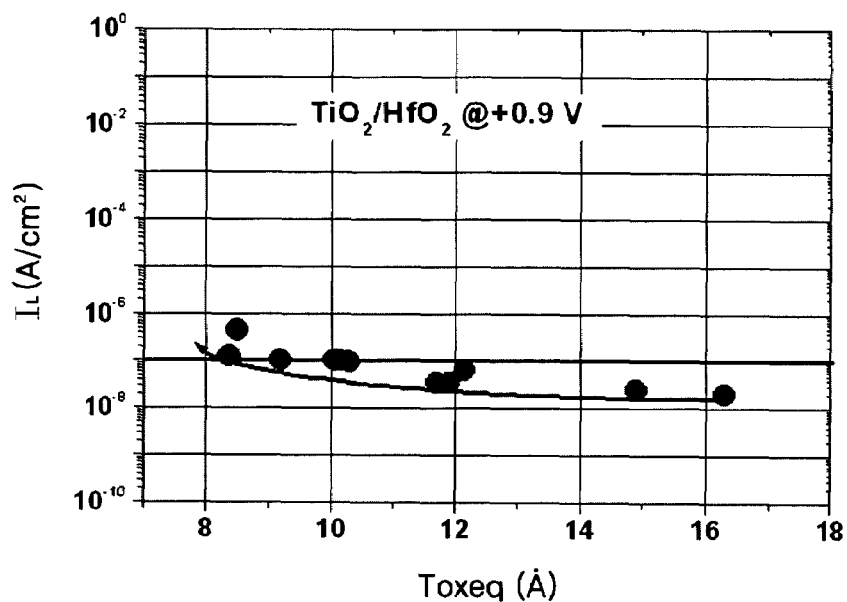
FIG. 4A is a graph illustrating a relationship between leakage current and the dielectric thickness of MIM capacitors according to certain embodiments of the present invention.
Figure 4B:
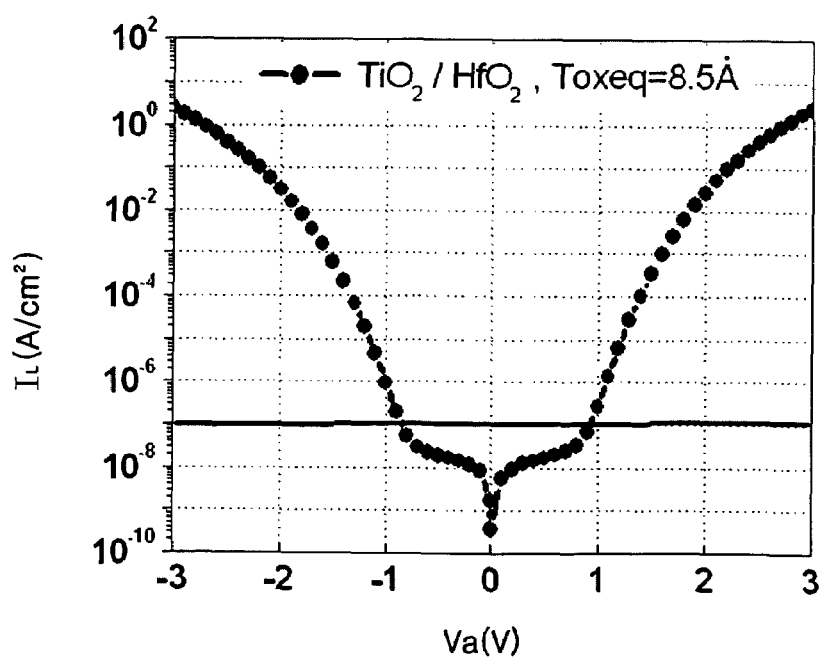
FIG. 4B is a graph illustrating current versus voltage characteristics of MIM capacitors formed according to certain embodiments of the present invention.
Figure 5A:
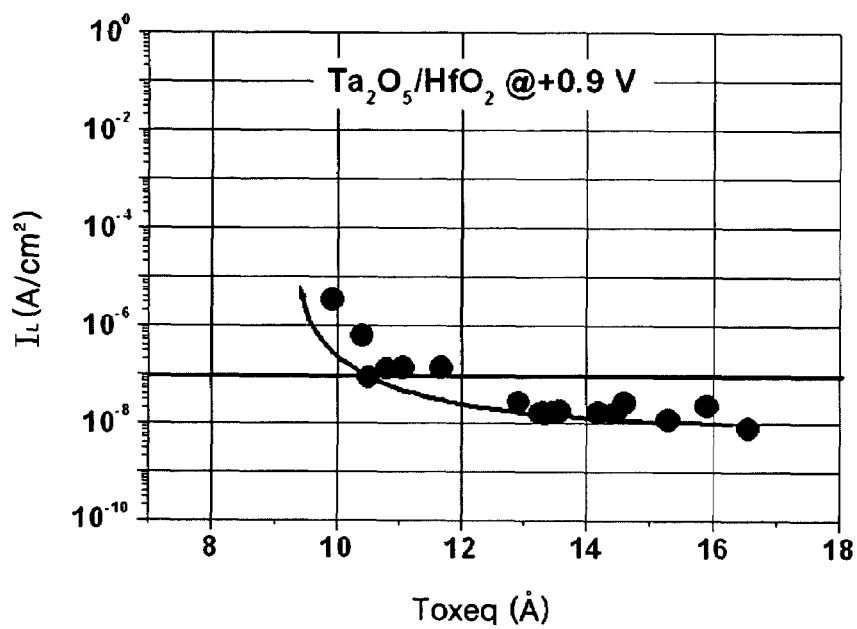
FIG. 5A is a graph illustrating a relationship between leakage current and the dielectric thickness of MIM capacitors according to further embodiments of the present invention.
Figure 5B:
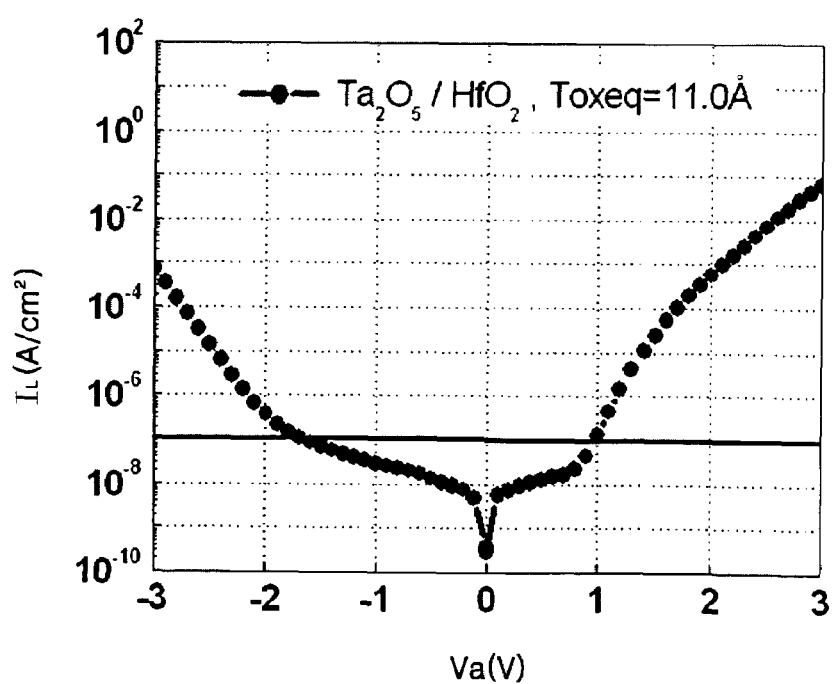
FIG. 5B is a graph illustrating current versus voltage characteristics of MIM capacitors formed according to further embodiments of the present invention.

Hereinafter, the leakage current characteristic of certain MIM capacitors formed according to embodiments of the present invention will be described in conjunctions with the graphs of FIGS. 4A, 4B, 5A, 5B and 6. In FIGS. 4A and 5A, the x-axis represents the EOT (Toxeq) of the high-k dielectric layer interposed between the lower electrode and the upper electrode, and the y-axis represents the leakage current density (IL) flowing through the high-k dielectric layer. In FIGS. 4B and 5B, the x-axis represents the voltages (Va) applied between the lower electrode and the upper electrode, and the y-axis represents the leakage current density (IL) flowing through the high-k dielectric layer.

FIG. 4A is a graph illustrating a relationship between the leakage current and the EOT of MIM capacitors formed according to embodiments of the present invention. FIG. 4B is a graph illustrating a relationship between the leakage current and the applied voltages of MIM capacitors formed according to embodiments of the present invention.

The measurement results of FIGS. 4A and 4B were obtained from MIM capacitors that were formed as planar type structures. The lower electrodes of the MIM capacitors comprised titanium nitride layers, and the dielectric layers of the MIM capacitors comprised a titanium oxide upper dielectric layer that was stacked on a hafnium oxide lower dielectric layer. The upper electrode of the MIM capacitors comprised a ruthenium layer that was stacked on the titanium oxide upper dielectric layer. The lower electrode was oxidized uniformly using a rapid thermal oxidation process before forming the hafnium oxide layer. The rapid thermal oxidation process was performed for 1 minute at a temperature of 500° C. in an oxygen gas atmosphere at a pressure of 760 torr. The hafnium oxide layer was formed using an ALD process at a temperature of 300° C. using TEMAH as the source gas and ozone ($O_3$) as the oxidation gas. The titanium oxide layer was also formed using an ALD process at a temperature of 300° C. using $TiCl_4$ as a source gas and ozone ($O_3$) as the oxidation gas. The ruthenium layer was formed using a CVD process at a temperature of 300° C. using $Ru(EtCp)_2$ as the source gas and oxygen ($O_2$) as the reactant gas.

The leakage current density (IL) of FIG. 4A is the electric current density flowing through the high-k dielectric layer when 0.9 V of voltage is applied between the lower electrode and the upper electrode. Further, the hafnium oxide layer and the titanium oxide layer of the MIM capacitor showing the measurement results of FIG. 4B are each formed to a thickness of 30 Angstroms.

Figure 2:
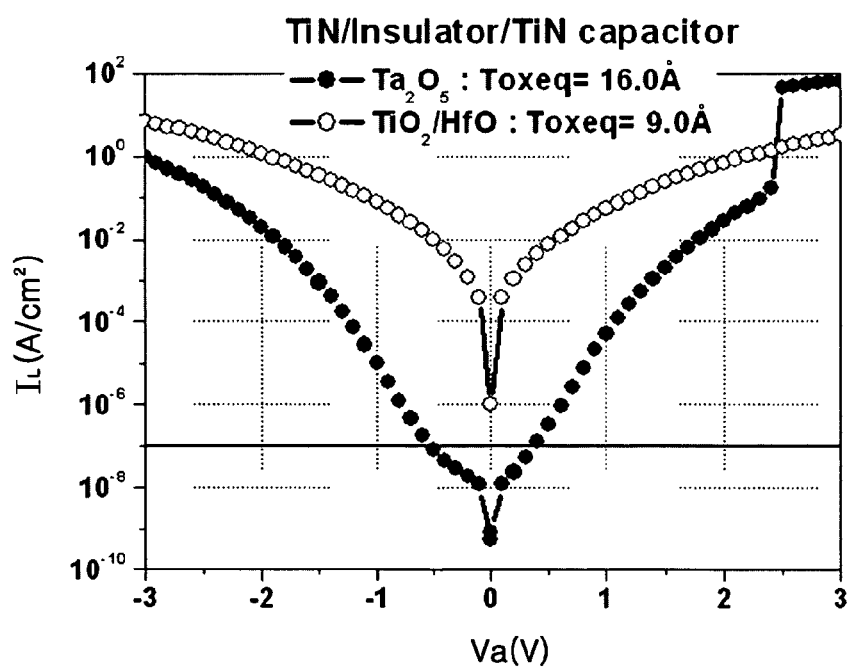
FIG. 2 is a graph illustrating leakage current characteristics of certain conventional MIM capacitors.

As shown in FIGS. 4A and 4B, the exemplary MIM capacitors formed according to embodiments of the present invention exhibit about $1 \times 10^{-7}$ $A/cm^2$ of stable leakage current density with about 9 Angstroms of EOT. Thus, the exemplary MIM capacitors formed according to certain embodiments of the present invention show improved leakage current characteristic in comparison with the conventional MIM capacitors shown in FIG. 2.

FIG. 5A is a graph illustrating the relationship between the leakage current and the EOT of MIM capacitors formed according to further embodiments of the present invention, and FIG. 5B is a graph illustrating the relationship between the leakage current and the applied voltage of these MIM capacitors.

The MIM capacitors that were measured to obtain the measurement results of FIGS. 5A and 5B were identical to the MIM capacitors corresponding to FIGS. 4A and 4B except in their upper dielectric layer. In particular, the MIM capacitors corresponding to FIGS. 5A and 5B used a tantalum oxide layer for the upper dielectric layer instead of a titanium oxide layer. This tantalum oxide layer was formed using a CVD process at a temperature of 430° C. that was performed using $Ta(Oet)_5$ as the source gas and oxygen ($O_2$) as the oxidation gas.

The leakage current density (IL) of FIG. 5A is the electric current density flowing through the high-k dielectric layer when 0.9 V of voltage is applied between the lower electrode and the upper electrode. In the MIM capacitors corresponding to FIGS. 5A and 5B the hafnium oxide layer was formed to a thickness of 35 Angstroms and the tantalum oxide layer was formed to a thickness of 30 Angstroms. As shown in FIGS. 5A and 5B, these MIM capacitors exhibit a stable leakage current density of about $1 \times 10^{-7}$ $A/cm^2$ with about 11 Angstroms of EOT.

Figure 6:
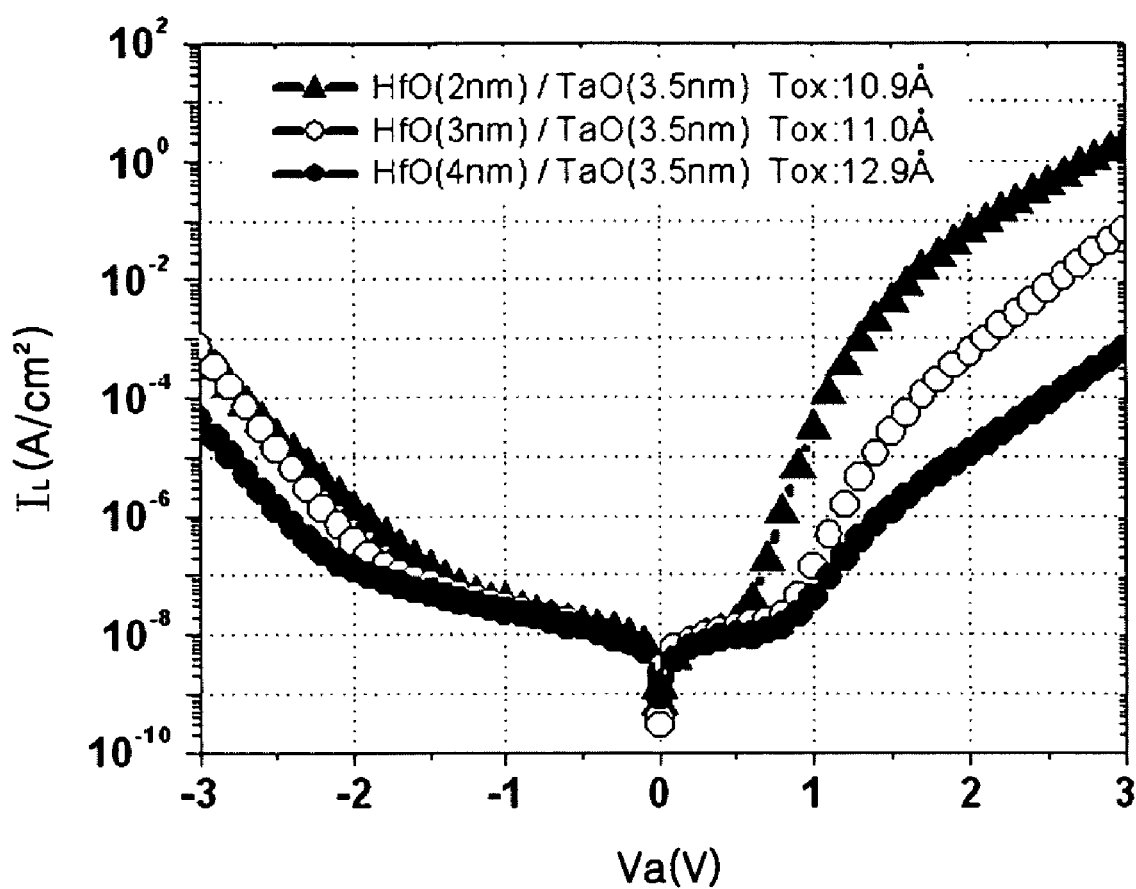
FIG. 6 is a graph illustrating current versus voltage characteristics of MIM capacitors formed according to still further embodiments of the present invention.

FIG. 6 is a graph illustrating the leakage current characteristic of the MIM capacitors of FIGS. 5A and 5B as a function of the thickness of the hafnium oxide layer. In the MIM capacitors used to gather the measurement results of FIG. 6, the tantalum oxide layer in each case was formed to a thickness of 3.5 nm. In FIG. 6, the x-axis represents the voltage (Va) applied between the upper electrodes and the lower electrodes of the MIM capacitors, and the y-axis represents the leakage current density (IL).

As described above, according to some embodiments of the present invention, MIM capacitors are provided which include a high-k dielectric layer that may be formed by sequentially stacking a lower dielectric layer and an upper dielectric layer on a lower electrode. An upper electrode is formed on the upper dielectric layer. The lower dielectric layer may be formed of a material having a large energy band gap in comparison with the upper dielectric layer, and the upper electrode may be formed of a metal layer that has a high work function in comparison with the lower electrode. In this manner, the energy barrier between the lower electrode and the lower dielectric layer, and the energy barrier between the upper electrode and the upper dielectric layer can be increased.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a capacitor comprising:
   forming a lower electrode on a semiconductor substrate;
   forming a lower dielectric layer having a thickness of about 20 to 40 Angstroms on the lower electrode;
   forming an upper dielectric layer having a thickness of about 10 to 60 Angstroms on the lower dielectric layer, wherein a dielectric constant of the upper dielectric layer is greater than a dielectric constant of the lower dielectric layer, and wherein the energy band gap of the upper dielectric layer is smaller than the energy band gap of the lower dielectric layer; and
   forming an upper electrode on the upper dielectric layer, wherein the upper electrode comprises a noble metal that has a higher work function than a work function of the lower electrode.

2. The method according to claim 1, wherein the lower electrode comprises a metal nitride layer.

3. The method according to claim 2, wherein the metal nitride layer comprises at least one of a titanium nitride (TiN) layer, a titanium silicon nitride (TiSiN) layer, a titanium aluminum nitride (TiAlN) layer, a tantalum nitride (TaN) layer, a tantalum silicon nitride (TaSiN) layer, a tantalum aluminum nitride (TaAlN) layer, and/or a tungsten nitride (WN) layer.

4. The method according to claim 1, the method further comprising oxidizing at least some portions of the lower electrode before forming the lower dielectric layer.

5. The method according to claim 4, wherein oxidizing at least some portions of the lower electrode comprises performing a rapid thermal oxidation process on the lower electrode.

6. The method according to claim 5, wherein the rapid thermal oxidation process is performed for about 10 to 300 seconds at a temperature of about 300 to 550° C. with a pressure of about 0.1 to 760 torr.

7. The method according to claim 1, wherein forming the lower electrode comprises forming a lower electrode having a stack structure, a cylinder structure, or a concave structure.

8. The method according to claim 1, wherein the lower dielectric layer comprises at least one of a hafnium oxide ($HfO_2$) layer, a zirconium oxide ($ZrO_2$) layer, an aluminum oxide ($Al_2O_3$) layer, and/or a lanthanum oxide ($La_2O_3$) layer.

9. The method according to claim 1, the method further comprising performing an ammonia plasma treatment process on the lower dielectric layer before forming the upper dielectric layer.

10. The method according to claim 9, wherein the ammonia plasma treatment process is performed using a power of about 250 to 350 W at a temperature of about 400° C. or lower and with a pressure of about 2 torr.

11. The method according to claim 1, the method further comprising forming an intermediate dielectric layer on the lower dielectric layer before forming the upper dielectric layer.

12. The method according to claim 11, wherein the intermediate dielectric layer comprises at least one of a $HfO_2$ layer, a $ZrO_2$ layer, an $Al_2O_3$ layer, a $La_2O_3$ layer, a $Ta_2O_5$ layer, a $TiO_2$ layer, and/or an STO layer.

13. The method according to claim 1, wherein the upper dielectric layer comprises at least one of a $Ta_2O_5$ layer, a $TiO_2$ layer, and/or an STO layer.

14. The method according to claim 13, wherein the upper dielectric layer comprises a doped TiO2 layer.

15. The method according to claim 11, the method further comprising thermally annealing at least the intermediate dielectric layer in an $O_2$, $O_3$ and/or $N_2O$ gas atmosphere and/or performing a plasma treatment process using plasma formed from $O_2$ and/or $N_2O$ gas on at least the intermediate dielectric layer.

16. The method according to claim 1, the method further comprising thermally annealing at least the upper dielectric layer in an $O_2$, $O_3$ and/or $N_2O$ gas atmosphere and/or performing a plasma treatment process on at least the upper dielectric layer using plasma formed from $O_2$ and/or $N_2O$ gas.

17. The method according to claim 1, wherein the upper electrode comprises at least one of a Ru layer, an Ir layer, and/or a Pt layer.

18. An MIM capacitor, comprising:
a lower electrode on a semiconductor substrate;
a lower dielectric layer having a thickness of about 20 to 40 Angstroms on the lower electrode, the lower dielectric layer having a first dielectric constant and a first energy band gap;
an upper dielectric layer having a thickness of about 10 to 60 Angstroms on the lower dielectric layer, the upper dielectric layer having a second dielectric constant and a second energy band gap; wherein the second dielectric constant is higher than the first dielectric constant and the second energy band gap is smaller than the first energy band gap; and
an upper electrode on the upper dielectric layer, the upper electrode comprising a noble metal that has a higher work function than a work function of the lower electrode.

19. The MIM capacitor according to claim 18, wherein the lower electrode comprises a metal nitride layer.

20. The MIM capacitor according to claim 19, wherein the metal nitride layer comprises at least one of a titanium nitride (TiN) layer, a titanium silicon nitride (TiSiN) layer, a titanium aluminum nitride (TiAlN) layer, a tantalum nitride (TaN) layer, a tantalum silicon nitride (TaSiN) layer, a tantalum aluminum nitride (TaAlN) layer, and/or a tungsten nitride (WN) layer.

21. The MIM capacitor according to claim 18, wherein at least certain surface portions of the lower electrode are oxidized.

22. The MIM capacitor according to claim 18, wherein the lower dielectric layer comprises at least one of a hafnium oxide ($HfO_2$) layer, a zirconium oxide ($ZrO_2$) layer, an aluminum oxide ($Al_2O_3$) layer, and/or a lanthanum oxide ($La_2O_3$) layer.

23. The MIM capacitor according to claim 18, further comprising an intermediate dielectric layer between the lower dielectric layer and the upper dielectric layer.

24. The MIM capacitor according to claim 23, wherein the intermediate dielectric layer comprises at least one of a $HfO_2$ layer, a $ZrO_2$ layer, an $Al_2O_3$ layer, a $La_2O_3$ layer, a $Ta_2O_5$ layer, a $TiO_2$ layer, and/or an STO layer.

25. The MIM capacitor according to claim 18, wherein the upper dielectric layer comprises at least one of a $Ta_2O_5$ layer, a $TiO_2$ layer, and/or an STO layer.

26. The MIM capacitor according to claim 18, wherein the upper electrode comprises at least one of a Ru layer, an Ir layer, and a Pt layer.

27. An MIM capacitor, comprising:
a lower electrode on a semiconductor substrate;
a lower dielectric layer on the lower electrode, the lower dielectric layer having a first dielectric constant and a first energy band gap;
an upper dielectric layer on the lower dielectric layer, the upper dielectric layer having a second dielectric constant and a second energy band gap; wherein the second dielectric constant is higher than the first dielectric constant and the second energy band gap is smaller than the first energy band gap; and
an upper electrode on the upper dielectric layer, the upper electrode comprising a noble metal that has a higher work function than a work function of the lower electrode.

28. The MIM capacitor according to claim 27, further comprising an intermediate dielectric layer between the lower dielectric layer and the upper dielectric layer.

29. The MIM capacitor according to claim 28, wherein the lower dielectric layer has a thickness of about 20 to 40 Angstroms.

30. The MIM capacitor of claim 29, wherein the upper dielectric layer has a thickness of about 10 to 60 Angstroms.

31. The MIM capacitor according to claim 28, wherein the intermediate dielectric layer comprises at least one of a $HfO_2$ layer, a $ZrO_2$ layer, an $Al_2O_3$ layer, a $La_2O_3$ layer, a $Ta_2O_5$ layer, a $TiO_2$ layer, and/or an STO layer.

* * * * *